(12) United States Patent
Li

(10) Patent No.: US 10,078,108 B2
(45) Date of Patent: Sep. 18, 2018

(54) TEST STRUCTURE, FABRICATION METHOD, AND TEST METHOD

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 27 days.

(21) Appl. No.: 15/238,616

(22) Filed: Aug. 16, 2016

(65) Prior Publication Data

US 2017/0082678 A1 Mar. 23, 2017

(30) Foreign Application Priority Data

Sep. 23, 2015 (CN) .......................... 2015 1 0612745

(51) Int. Cl.
*G01R 31/02* (2006.01)
*G01R 31/26* (2014.01)
(Continued)

(52) U.S. Cl.
CPC ..... *G01R 31/2628* (2013.01); *G01R 31/2644* (2013.01); *H01L 21/823814* (2013.01);
(Continued)

(58) Field of Classification Search
CPC ........ G01R 21/133; G01R 27/14; G06F 13/20
(Continued)

(56) References Cited

U.S. PATENT DOCUMENTS 6,617,972 B2* 9/2003 Takarada ............ G08B 21/0484
324/538
8,779,729 B2* 7/2014 Shiraishi ............ G01R 31/3606
320/134
(Continued)

*Primary Examiner* — Giovanni Astacio-Oquendo
(74) *Attorney, Agent, or Firm* — Anova Law Group, PLLC

(57) ABSTRACT

The present disclosure provides test structures, fabrication methods thereof and test methods thereof. An exemplary test structure includes a substrate having a to-be-tested region having at least one fin and a peripheral region having at least one fin surrounding the to-be-tested region; an insulation layer covering portions of side surfaces of the fins; at least one first gate structure covering side and top surfaces of the fin in the to-be-tested region; second gate structures covering side and top surfaces of the fins in the peripheral region; source/drain regions formed in portions of the fins between adjacent second gate structures and portions of the fins between the first gate structure and adjacent second gate structures; and a plurality of first conductive structures formed between adjacent second gate structures in the peripheral region. The plurality of first conductive structures cross over and are on source/drain regions of at least two fins.

20 Claims, 6 Drawing Sheets

(51) Int. Cl.

| | |
|---|---|
| *H01L 27/092* | (2006.01) |
| *H01L 29/08* | (2006.01) |
| *H01L 29/161* | (2006.01) |
| *H01L 29/16* | (2006.01) |
| *H01L 29/165* | (2006.01) |
| *H01L 29/78* | (2006.01) |
| *H01L 21/8238* | (2006.01) |
| *H01L 29/66* | (2006.01) |
| *H01L 21/66* | (2006.01) |

(52) U.S. Cl.
CPC ........ *H01L 21/823821* (2013.01); *H01L 21/823828* (2013.01); *H01L 22/12* (2013.01); *H01L 22/30* (2013.01); *H01L 22/34* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/7848* (2013.01)

(58) Field of Classification Search
USPC ............ 324/76.11, 76.61, 76.69, 76.74, 103
See application file for complete search history.

(56) References Cited

U.S. PATENT DOCUMENTS

| | | |
|---|---|---|
| 2007/0284576 A1 | 12/2007 | Pacha et al. |
| 2008/0062022 A1* | 3/2008 | Melanson ............ H03M 3/464 341/143 |
| 2008/0079444 A1* | 4/2008 | Denison ................ G01D 5/24 324/679 |
| 2009/0204350 A1* | 8/2009 | Govil ................ B81C 99/0045 702/65 |
| 2012/0098518 A1* | 4/2012 | Unagami ............ G01R 22/066 324/74 |
| 2013/0228866 A1 | 9/2013 | Lee |
| 2013/0277746 A1 | 10/2013 | Baldauf |
| 2014/0217502 A1 | 8/2014 | Chang et al. |
| 2015/0035568 A1 | 2/2015 | Peng et al. |
| 2015/0098489 A1 | 4/2015 | Lee et al. |

* cited by examiner

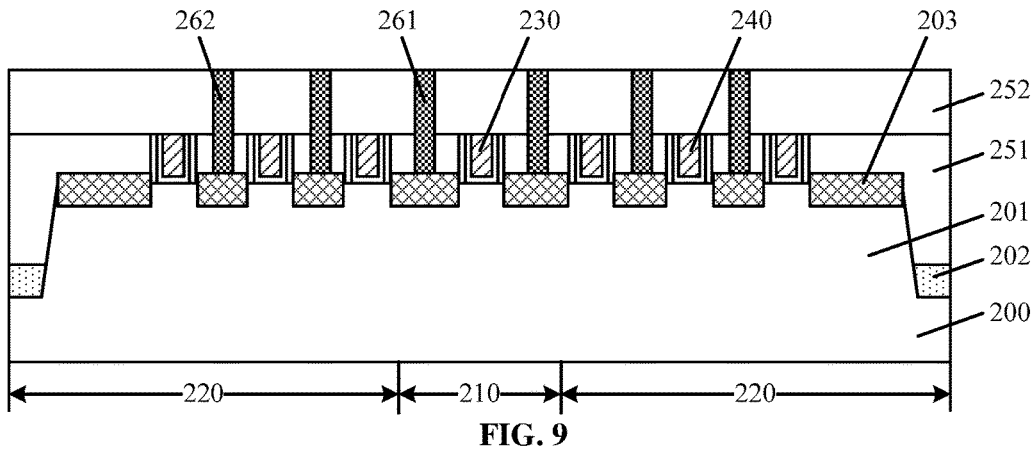

FIG. 9

Providing a testing structure having at least one first transistor in a to-be-tested region and a plurality of second transistors in a peripheral region — S1

Turning on the first transistor and the second transistors — S2

Performing temperature tests on the second transistors to obtain temperatures on the fins under the second gate structures — S3

Obtaining the correlation curves of the temperatures on the fins in the peripheral region and time — S4

TEST STRUCTURE, FABRICATION METHOD, AND TEST METHOD

CROSS-REFERENCES TO RELATED APPLICATIONS

This application claims the priority of Chinese patent application No. 201510612745.8, filed on Sep. 23, 2015, the entirety of which is incorporated herein by reference.

FIELD OF THE INVENTION

The present invention generally relates to the field of semiconductor manufacturing technology and, more particularly, relates to test structures and fabrication processes, and test methods.

BACKGROUND

With the continuous development of the semiconductor technology, semiconductor devices have been developed toward higher device densities and higher integration levels. As the basic semiconductor devices, transistors have been widely used. When the device density and the integration level are increased, the critical dimension of the gates of planar transistors has become smaller and smaller. Such a critical dimension reduction has caused the control ability of the conventional transistors on their channel currents to be weaker. Thus, the short-channel effect and the leakage current often occur; and the performances of the semiconductor devices are adversely affected.

To overcome the short channel effect, and inhibit the leakage current, fin field-effect transistors (FinFETs) have been developed. FinFETs are a typical type of multi-gate devices. A FinFET includes at least one fin and a dielectric layer formed on the surface of a semiconductor substrate. The dielectric layer covers the side surfaces of the at least one fin; and the top surface of the dielectric layer is lower than the top surface of the at least one fin. The FinFET also includes a gate structure formed on the top and side surfaces and the dielectric layer; and a source formed in the fin at one side of the gate structure and a drain formed in the fin at the other side of the gate structure.

However, with the continuous shrinking of the critical dimension of the semiconductor devices, the distances between adjacent fins have become smaller and smaller. Thus, the heat dissipation ability among fins has become worse and worse. The heat accumulated in the fins may adversely affect the performance of the semiconductor devices. Thus, determining the relationship between the heat in the fins and the performance of the FinFETs becomes a key factor for evaluating the reliability of the FinFETs.

The disclosed device structures and methods are directed to solve one or more problems set forth above and other problems in the art.

BRIEF SUMMARY OF THE DISCLOSURE

One aspect of the present disclosure includes a test structure. The test structure includes a substrate having a to-be-tested region and a peripheral region surrounding the to-be-tested region. The to-be-tested region has at least one fin. The peripheral region has at least one fin. The at least one fin in the to-be-tested region is parallel to the at least one fin in the peripheral region, and two ends of the at least one fin in the to-be-tested region extends into the peripheral region. The test structure also includes an insulation layer covering portions of side surfaces of the fins; at least one first gate structure covering side and top surfaces of the at least one fin in the to-be-tested region; and a plurality of parallel second gate structures covering side and top surfaces of the at least one fin in the peripheral region. The plurality of second gate structures are parallel to the at least one first gate structure. Further, the test structure also includes source/drain regions formed in portions of the at least one fin between adjacent second gate structures and portions of the at least one fin between the at least one first gate structure and adjacent second gate structures; and a plurality of first conductive structures formed between adjacent second gate structures in the peripheral region. The plurality of first conductive structures cross over at least two fins; and may be on surfaces of source/drain regions in the at least two fins.

Another aspect of the present disclosure includes a method for fabricating a test structure. The method includes providing a substrate having a to-be-tested region and a peripheral region; and forming at least one fin on the substrate in the to-be-tested region and at least one fin on the substrate in the peripheral region. The at least one fin in the to-be-tested region and the at least one fin in the peripheral region are parallel; and two ends of the at least one fin in the to-be-tested region extend into the peripheral region. The method also includes forming an insulation layer covering portions of side surfaces of the fins over the substrate; and forming at least one first gate structure crossing over the at least one fin in the to-be-tested region and covering portions of side surfaces of the at least one fin in the to-be-tested region over the insulation layer. Further, the method includes forming a plurality of parallel second gate structures covering portions of side surfaces of the at least one fin in the peripheral region, crossing over the at least one fin in the peripheral region and being parallel to the at least one first gate structure over the insulation layer; and forming source/drain regions in portions of the fins between adjacent second gate structures and portions of the fins between the at least one first gate structure and adjacent second gate structures; and forming a plurality of first conducive structures in the peripheral region. The plurality of first conductive structures are in between adjacent second gate structures; and cross over at least two fins; and on surfaces of source/drain regions of at least two fins.

Another aspect of the present disclosure includes a test method. The test method includes providing a test structure a substrate having a to-be-tested region having at least one fin and a peripheral region having at least one fin surrounding the to-be-tested region; an insulation lay covering portions of side surfaces of the fins; at least one first gate structure covering side and top surfaces of the at least one fin in the to-be-tested region; a plurality of parallel second gate structures covering side and top surfaces of the at least one fin in the peripheral region, the second gate structures being parallel to the first gate structure; source/drain regions formed in portions of the at least one fin between adjacent second gate structures and portions of the at least one fin between the at least one first gate structure and adjacent second gate structures; and a plurality of first conductive structures formed between adjacent second gate structures in the peripheral region. The plurality of first conductive structures cross over at least two fins and are on surfaces of source/drain regions of at least two fins. A first gate structure and a source region at one side of the first gate structure and a corresponding drain region at another side of the first gate structure form a first transistor. A second gate structure and a source region at one side of the second gate structure and a corresponding drain region at another side of the second gate structure form a second transistor. The to-be-test region has at least one first transistor; and the peripheral region has a plurality of second transistors. The test method also includes turning on the at least one first transistor; and performing temperature tests on the plurality of second transistors with pre-determined time intervals to obtain temperatures of the fins under the second gate structures; and obtaining correlations between the temperatures of the fins in the peripheral region and time.

Other aspects of the present disclosure can be understood by those skilled in the art in light of the description, the claims, and the drawings of the present disclosure.

BRIEF DESCRIPTION OF THE DRAWINGS

FIGS. 3-9 illustrate semiconductor structures corresponding certain stages of an exemplary fabrication process of a test structure consistent with the disclosed embodiments;

FIG. 10 illustrates an exemplary test process consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As mentioned previously, with the continuous shrinking of the semiconductor devices, the distances between adjacent fins have become smaller and the smaller. Such a reduction may causes a heat accumulation in the fins; and the performance of the FinFETs may be adversely affected.

When a transistor is in operation, because a current may be generated in its channel region, the channel region may function as a transistor. That is, heat may be generated when the channel region is turned on. Further, the transistor may cause the substrate to generate heat. For a FinFET, the channel region may be formed in the fin. Thus, when the channel region is turned on, the fin may generate heat.

Figure 1:
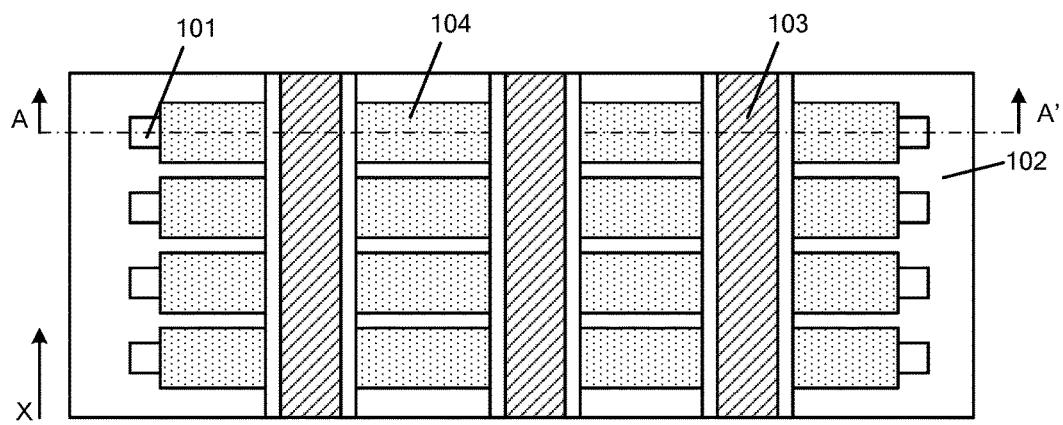
FIG. 1 illustrates a top view of an exemplary FinFET consistent with the disclosed embodiments.
Figure 2:
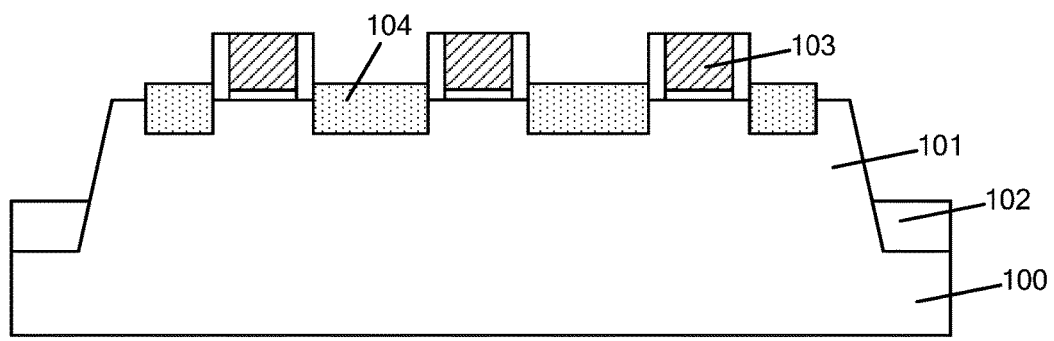
FIG. 2 illustrates a cross-sectional view of the structure illustrated in FIG. 1 along the AA' direction.

FIG. 1 illustrates an exemplary FinFET consistent with the disclosed embodiments. FIG. 2 is a cross-sectional view of the structure illustrated in FIG. 1 along the AA' direction.

As shown in FIGS. 1-2, the FinFET may include a substrate 100; a plurality of fins 101 formed on the surface of the substrate 100; an insulation layer 102 covering the side surfaces of the fins 101 and with a top surface lower than the top surfaces of the fins 101 formed on the surface of the substrate 100; a gate structure 103 covering portions of the side and top surfaces of the fins 101 and a portion of the insulation layer 101 formed over the substrate 101; and a source region 104 and a drain region 104 formed in the fin 101 at two sides of the gate structure 103, respectively.

The plurality of fins 101 may be aligned in parallel along the X direction illustrated in FIG. 1. Further, the gate structure 103 may cross over the plurality of fins 101. When the FinFET is in operation, the channel region between two source/drain regions 104 may be turned on; and an electric current may be generated in the channel region. Thus, the fin 101 may generate heat.

However, with the continuous shrinking of the CD of the semiconductor devices, the device density may be increased. The top size of the fins 101 along the X direction may be reduced; and the distance between adjacent fins 101 may be shrunk. The top size of the fins 101 along the X direction may be the width of the channel region. Thus, the width of the channel region may be reduced. The width reduction of the channel region may increase the resistance of the channel region; and the heating generating issue may be more severe; and the inner of the fins 101 may self-heat. Further, the distance reduction of adjacent fins 101 may prevent of the dissipation of the heat generated by the self-heating; and the temperature of the fins may gradually increase. Such a temperature increase may cause the FinFETs to have a serials of electrical property changes, such as saturation current changes; and sub-threshold swing, etc. The electrical property changes may adversely affect the performance of the FinFETs. Thus, understanding the relationship between the self-heating of the fins 101 and the electrical properties of the FinFETs may become a key approach to tune and improve the performance of the FinFETs.

Figure 11:
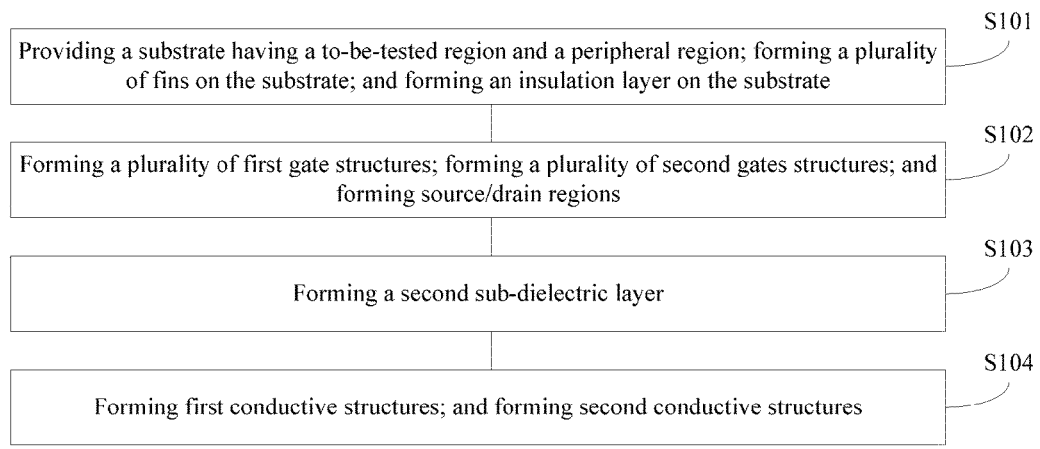
FIG. 11 illustrates an exemplary fabrication process of a test structure consistent with the disclosed embodiments.

FIG. 11 illustrates an exemplary fabrication process of a test structure consistent with the disclosed embodiments. FIGS. 4-9 illustrate semiconductor structures corresponding to certain stages of the exemplary fabrication process.

Figure 3:
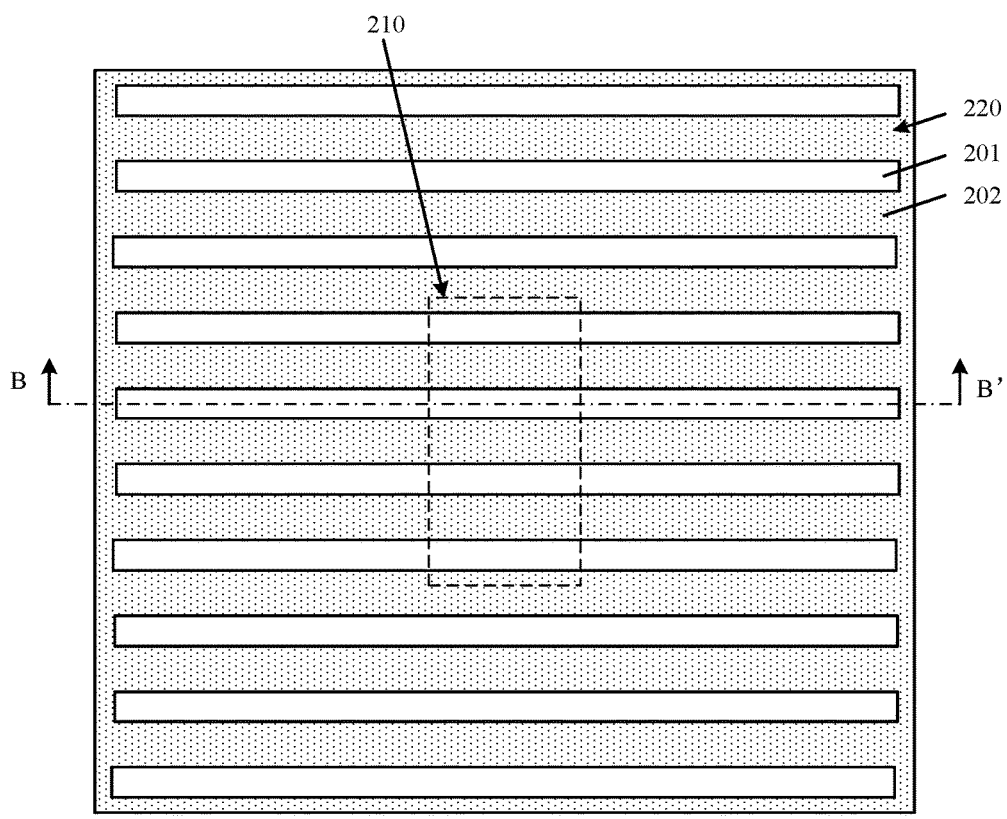
Figure 4:
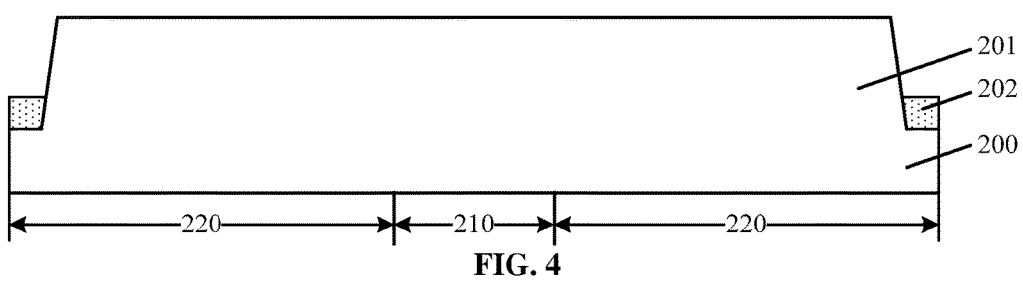

As shown in FIG. 11, at the beginning of the fabrication process, a substrate with certain structures is provided (S101). FIG. 3 illustrates a corresponding semiconductor structure. FIG. 4 illustrates a cross-sectional view of the structure illustrated in FIG. 3 along the BB' direction.

As shown in FIGS. 3-4, a substrate 200 is provided. The substrate 200 may include a to-be-tested region 210 and a peripheral region 220 surrounding the to-be-tested region 210. The to-be-tested region 210 and the peripheral region 220 may respectively include at least one fin 201. For illustrative purposes, a plurality of fins 201 are shown.

The plurality of fins 201 in the to-be-tested region 210 and the peripheral region 220 may be parallel. The at least one fin 201 in the to-be-tested region 210 may extend into the peripheral region 220. Further, an insulation layer 202 may be formed on the surface of the substrate 200; and the insulation layer 202 may cover portions of the side surfaces of the fins 201.

The to-be-tested region 210 may be used to form to-be-tested FinFETs. The to-be-tested FinFETs may form desired semiconductor devices and circuit structures.

The peripheral region 220 may be used to monitor the heat transfer from the fins 201 in the top-be-tested region 210 to the peripheral region 220. By subsequently testing the current and the voltage of a plurality of FinFETs subsequently formed in the peripheral region 220, the temperature of the channel regions of the plurality of FinFETs in the peripheral region 220 may be obtained; and the temperature distribution of the fins at different positions of the peripheral region 220 may be obtained.

The number of the fins 201 in the to-be-test region 210 may be equal to, or greater than 1. Further, when the number of the fins 201 in the to-be-tested region 210 is greater than 1, the plurality of the fins 201 in the to-be-tested region 210 may be parallel. In one embodiment, the to-be-tested region 201 have four parallel fins 201. In certain other embodiments, the to-be-tested region 210 may have 3-6 parallel fins.

The two ends of the fins 201 in the to-be-tested region 210 may extend into the peripheral region 220. Thus, first gate structures may be subsequently formed on the surfaces of the fins 210 in the to-be-tested region 210, and second gate structures may be subsequently formed on same fins 210 but the in peripheral region 220. The first gate structures may be used to form the FinFETs in the to-be-tested region 210; and the second gate structures may be used to form the FinFETs in the peripheral region 220. Further, the first gate structures and the second gate structures may share same source/drain regions. Thus, when the FinFETs 201 in the to-be-tested region 210 are in operation, the heat generated in the fins 201 in the to-be-tested region 201 may be easily transferred to the fins 201 in the peripheral region 220. Thus, it may be able to monitor the trend and change of the heat transfer in the fins 201 in the peripheral region 220.

The number of fins 201 in the peripheral region 220 may be equal to, or greater than 1. Some of the fins 201 in the peripheral region 220 may extend from the to-be-tested region 210. When the number of the fins 201 in the peripheral region 220 is greater than 1, the plurality of fins 201 in the peripheral region 220 may be parallel. Further, the fins 201 in the peripheral region 220 may be parallel to the fins 201 in the to-be-tested region 210.

In one embodiment, the fins 201 in the peripheral region 220 surround the fins 201 in the to-be-tested region 210. Thus, the heat transferred from the fins 201 in the to-be-tested region 210 to the fins 201 the peripheral region 220 may be distributed in the surrounding area of the to-be-tested region 210. Therefore, using the disclosed test structure, the heat distribution and the heat transfer in the surrounding region of the to-be-tested region 210 may be comprehensively obtained.

In one embodiment, the top width of the fins 201 may be smaller than approximately 20 nm, such as 14 nm, etc. In the to-be-tested region 210 and the peripheral region 220, the distance between adjacent fins 201 may be in a range of approximately 50 nm-60 nm. Because the distance between adjacent fins 201 may be relatively small; and the top width of the fins 201 may also be relatively small, it may be easy to accumulate heat in the fins 201; and it may be easy for the heat to transfer among the fins 201.

The fins 201 may be formed by any appropriate process. In one embodiment, the fins 201 may be formed on the substrate 201 by providing a semiconductor substrate; and forming a plurality of trenches in the surface of the substrate. The portions of the semiconductor substrate between adjacent trenches may be configured as the fins 201; and the portions of the semiconductor substrate under the fins 201 and the trenches may be configured as the substrate 200.

The semiconductor substrate may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate is made of single crystalline silicon. The semiconductor substrate provides a base for subsequent structures and processes.

In certain other embodiments, the process for forming the fins 201 may include forming a fin material layer on the substrate 200; and etching the fin material layer to form a plurality of trenches in the fin material layer. The portions of the fin material layer between adjacent trenches may be configured as the fins 201. The substrate 200 may be made of silicon, silicon germanium, silicon carbide, SOI, GOI, glass, or III-V compounds, etc. The fins 201 may be made of silicon, germanium, silicon carbide, or silicon germanium, etc.

The insulation layer 202 may be used to insulate the fins 201. The insulation layer 202 may be made of any appropriate material, such as one or more of silicon oxide, silicon nitride, silicon oxynitride, low dielectric constant material (low-K, the dielectric constant may be in a range of approximately 2.5-3.9), and ultra-low-K material (the dielectric constant is lower than 2.5), etc. In one embodiment, the insulation layer 202 is made of silicon oxide.

The process for forming the insulation layer 202 may include forming an insulation film on the surface of the substrate 200 and the fins 201; planarizing the insulation film until the top surfaces of the fins 201 are exposed; and performing an etch-back process to expose portions of the side surfaces of the fins 201. Thus, the insulation layer 202 with a top surface lower the top surfaces of the fins 201 may be formed.

Before or after forming the insulation layer 202, well regions may be formed in the fins 201 in the to-be-tested region 210 and the peripheral region 220. The well regions may be formed by any appropriate process, such as an ion implantation process, etc. When the to-be-tested region 210 and the peripheral region 220 are used to form P-type FinFETs, the well region may be doped with N-type ions. When the to-be-tested region 210 and the peripheral region 220 are used to form N-type FinFETs, the well region may be doped with P-type ions.

Figure 5:
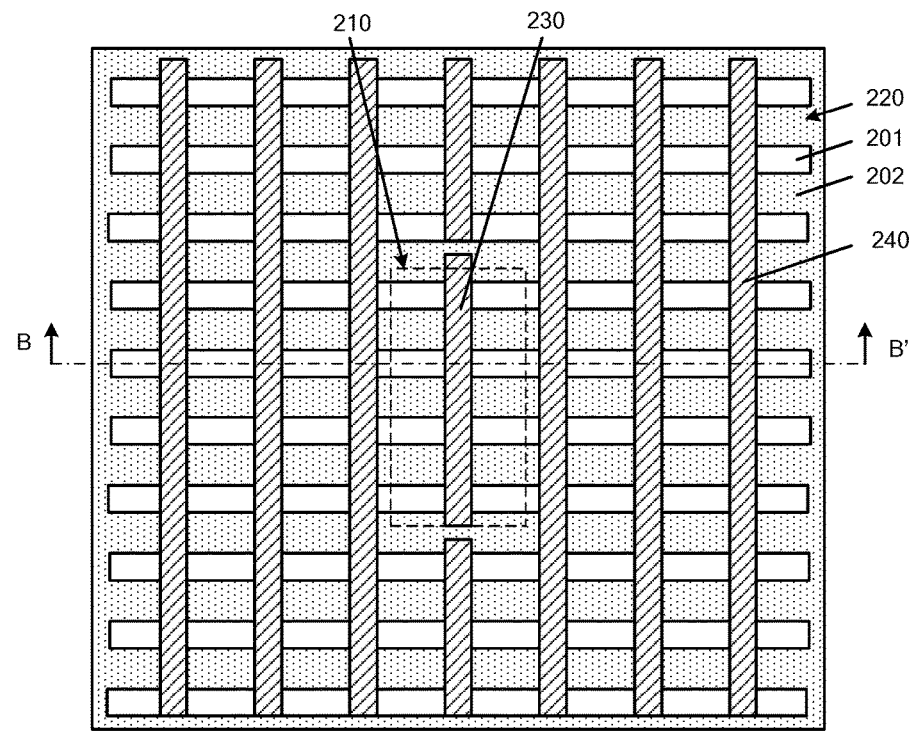
Figure 6:
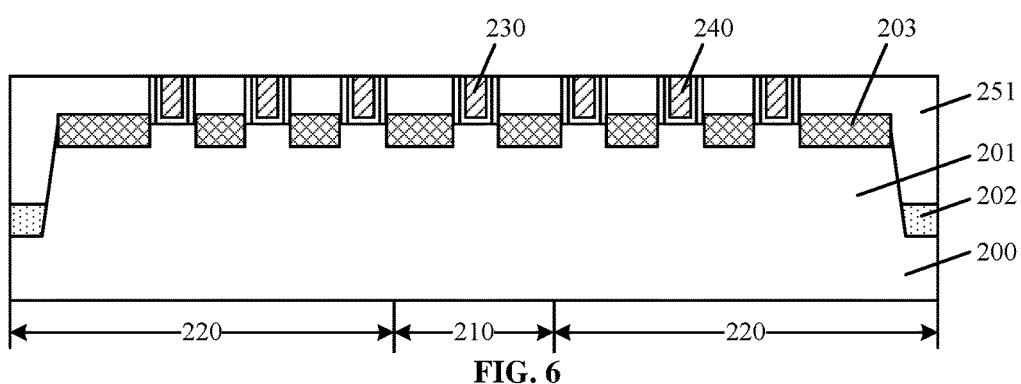

Returning to FIG. 11, after forming the fins 201, a plurality of first gate structures, a plurality of second gates structures, source regions and drain regions may be formed (S102). FIGS. 5-6 illustrate a corresponding semiconductor structure. FIG. 6 is the cross-sectional view of the structure illustrated in FIG. 5 along the BB' direction.

As shown FIGS. 5-6, a first gate structure 230 is formed over the fins 201 in the to-be-tested region 210. In certain other embodiments, the number of the first gate structures 203 may be greater than 1. The first gate structure 203 may cover the portions of the side surfaces and the top surfaces of the fins 201 in the to-be-tested region 210.

Further, a plurality of second gate structures 240 may be formed over the fins 201 in the peripheral region 220. The second gate structures 240 may cover portions of the side surfaces and the top surfaces of the fins 201 in the peripheral region 220. The plurality of second gate structures 240 may be parallel; and the second gate structures 240 may be parallel to the first gate structure 230.

Further, as shown in FIG. 6, source/drain regions 203 may be formed in the fins 201. The source/drain regions 203 may be formed in portions of the fins 201 between adjacent second gate structures 240, and/or portions of the fins 201 between the first gate structure 230 and the adjacent second gate structures 240. The source/drain regions 203 are not shown in FIG. 5.

The number of the first gate structure 230 may be equal to, or greater than 1; and each first gate structure 203 may cross over one or more parallel fins 201. In one embodiment, the number of the first gate structure is 1; and the first gate structure 230 may cross over four fins 201 in the to-be-tested region 210.

In the certain other embodiments, the number of the first gate structure 230 may be greater than 1. The plurality of first gate structures 230 may be parallel.

The second gate structures 240 may cross over one or more fins 201. In one embodiment, the second gate structures 240 cross over a plurality of fins 201.

At least one fin 201 in the to-be-tested region 210 may extend into the peripheral region 220. Further, the at least one fin 201 extending from the to-be-tested region 210 to the peripheral region 220 may be covered by one first gate structure 230 and one second gate structure 240 simultaneously. Further, the number of the second gate structures 203 covering the same fin 201 with the first gate structure 230 may be equal to, or greater than 1.

Because a first source/drain region 203 may be formed in between a first gate structure 230 and an adjacent second gate structure 240, the first gate structure 230 and the second gate structure 240 on the surface of the same fin 201 may share a same source/drain region 203 as the source or the drain of a transistor. Further, because the first gate structure 230 and the second gate structure 240 on the surface of the same fin 201 may share a same source/drain 203, the heat generated in the fin 201 in the to-be-tested region 210 may be transferred to the fin 201 in the peripheral region 220 through the shared source/drain region 203.

In one embodiment, the first gate structure 230 and the second gate structures 240 may be high-K metal gate (HKMG) structures. Thus, the first gate structure 230 and the second gate structures 204 may be formed by a gate-last process.

The process for forming the first gate structure 230 and the second gate structures 240 may include forming a first dummy gate structure over the fins 201 in the to-be-tested region 210. The first dummy gate structure may cover portions of the side surfaces and top surfaces of the first fins 201 in the to-be-tested region 210. The first dummy gate structure may include a dummy gate layer. The method may also include forming a plurality of the second dummy gate structures over the fins 201 in the peripheral region 220. The second dummy gate structures may cover portions of the side surfaces and the top surfaces of the fins 201 in the peripheral region 220. The plurality of second dummy gate structures may be parallel; and the plurality of second dummy gate structures may be parallel to the first dummy gate structure. The second dummy gate structures may include dummy gate layers. Further, the method may include forming a first sub-dielectric layer 251 on the surfaces of the insulation layer 202 and the surfaces of the fins 201, and the side surfaces of the first dummy gate structure and the second dummy gate structures. The first sub-dielectric layer 251 may expose the top surfaces of the dummy gate layers. Further, the method may also include removing the dummy gate layers to form openings; and forming a gate dielectric layer in the openings. Further, the method may also include forming a gate layer on the gate dielectric layer to fill the openings; and performing a planarization process until the sub-dielectric layer 251 is exposed. Thus, the first gate structure 230 may be formed in the to-be-tested region 210; and the second gate structures 240 may be formed in the peripheral region 220.

The first dummy gate structure may occupy a spatial position to subsequently form the first gate structure 203. The second dummy gate structures may occupy spatial positions to subsequently form the second gate structures 240. In one embodiment, the first dummy gate structure and the second dummy gate structures may be formed simultaneously. In certain other embodiments, the first dummy gate structure and the second dummy gate structures may be formed sequentially.

The dummy gate layers may be made of any appropriate material. In one embodiment, the dummy gate layers are made of polysilicon. The dummy gate layers are used to occupy spatial spaces for the subsequently formed gate dielectric layers and the subsequently formed gate layers. In one embodiment, the first dummy gate structure and the second dummy gate structures may include sidewall spacers formed on their side surfaces. The sidewall spacers may be made of one or more of silicon oxide, silicon nitride, and silicon oxynitride, etc. The sidewall spacers may be used to define the relative positions and distances between the dummy gate layers and the source/drain regions 203.

In one embodiment, a dummy gate dielectric layer may be formed between the dummy gate layers and the fins 201. The dummy gate dielectric layer may be made of silicon oxide; and an oxidation process may be used to form the dummy gate dielectric layer. The dummy gate dielectric layer may be used to prevent the damages to the exposed side surfaces and the top surfaces of the fins 201 during the subsequent processes for removing the dummy gate layers.

In one embodiment, after forming the first dummy gate structure and the second dummy gate structures and before forming the first sub-dielectric layer 251, the source/drain regions 203 may be formed. Each of the portions of the fins 201 between adjacent second gate structures may have one source/drain region 203. Each of the portions of the fins 201 between the first dummy gate structure and adjacent second gate structures may have one source/drain region 203.

Because the portions of the fins 201 between adjacent second gate structures and/or the portions of the fins 201 between the first dummy gate structure and adjacent second gate structures may have source/drain regions 203, the plurality of second gate structures 240 on surfaces of the same fins 201 and/or the first gate structure 230 and the second gate structures 240 on the surfaces of the same fins 201 may share same source/drain regions 203. Thus, the heat in the fins 201 in the to-be-tested region 210 may be transferred to the fins 201 in the peripheral region 220 through the shared source/drain regions 203.

In one embodiment, the source/drain regions 203 may include stress layers formed in the fins 201. The stress layers may be doped with certain ions.

In one embodiment, when FinFETs are PMOS transistors, the stress layers may be made of SiGe; and doped with P-type ions. The stress layers may be used to applied a compressive stress to the channel regions in the fins 201. In certain other embodiments, when the FinFETs are NMOS transistors, the stress layers may be made of silicon carbide; and doped with N-type ions. The stress layers may be used to apply a tensile stress to the channel regions in the fins 201.

Further, in a same fin 201, the source/drain regions 203 may be at the two sides of the first gate structure 230 and the second gate structures 240. Thus, the adjacent second gate structures 240 and/or the first gate structure 230 and the adjacent second gate structures 240 may share source regions or drain regions.

In certain other embodiments, when the FinFETs are PMOS transistors or NMOS transistors, the stress layers may be made of single crystal silicon. Such stress layers may be used to raise up the surfaces of the source/drain regions 203.

Various processes may be used to form the gate dielectric layer. In one embodiment, the gate dielectric layer is formed by an atomic layer deposition (ALD) process. The gate dielectric layer may be made of high-K material. The high-K material may include HfO, ZrO, HfSiO, LaO, ZrSiO, TiO, TaO, BaSrTiO, BaTiO, SrTiO, or AlO, etc.

The gate layer may be made of any appropriate material, such as one or more of metal and metal compound. The metal may include Cu, W, or Ag, etc. The metal and metal compound may also include one or more of Ta, Ti, TaN, TiN, and TiAl alloy, etc.

The first sub-dielectric layer 251 may be used to keep the shapes and positions of the first dummy gate structure and the second dummy gate structures. Keeping the shapes and positions of the first dummy gate structure and the second dummy gate structures may help to subsequently use a gate dielectric layer and a gate layer to substitute the dummy gate layer.

The process for forming the first sub-dielectric layer 251 may include forming a dielectric film on the surface of the insulation layer 202, the side and top surfaces of the fins 201, and the surfaces of the first dummy gate structure and the second dummy gate structures; and planarizing the dielectric film until the top surface of the dummy gate layer is exposed. Thus, the first sub-dielectric layer 251 may be formed.

Various processes may be used to form the dielectric film, such as a CVD process, a PVD process, or an ALD process, etc. The first sub-dielectric layer 251 may be made of any appropriate material, such as silicon oxide, silicon nitride, silicon oxynitride, low-K dielectric material, or ultra-low-K dielectric material, etc.

The dielectric constant of the low-K dielectric material may be equal to, or greater than 2.5 and smaller than 2.9. The low-K dielectric material may include porous silicon oxide, or porous silicon nitride, etc.

The dielectric constant of the ultra-low-K dielectric material may be lower than 2.5. The ultra-low-K dielectric material may include porous SiCOH, etc.

In one embodiment, the first sub-dielectric layer 251 is made of silicon oxide. The first sub-dielectric layer 251 may be formed by one or more of a flowable CVD (FCVD) process, and a high density plasma (HDP) deposition process, etc.

Figure 7:
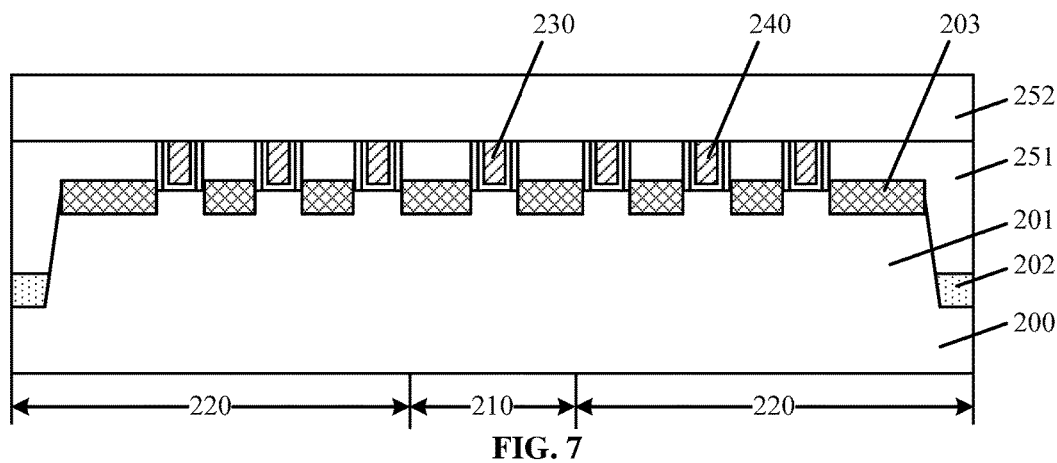

Returning to FIG. 11, after forming the first sub-dielectric layer 251, a second sub-dielectric layer may be formed (S103). FIG. 7 illustrates a corresponding semiconductor structure.

As shown in FIG. 7, a second sub-dielectric layer 252 is formed on the surfaces of the first gate structure 230, the second gate structures 240 and the first sub-dielectric layer 251. The first sub-dielectric layer 251 and the second sub-dielectric layer 252 may form a dielectric layer. Conductive structures may be subsequently formed in the dielectric layer.

Various process may be used to form the second sub-dielectric layer 252, such as a CVD process, a PVD process, or an ALD process, etc. The second sub-dielectric layer 252 may be made of any appropriate material, such as silicon oxide, silicon nitride, silicon oxynitride, low-K dielectric material, or ultra-low-K dielectric material, etc.

The dielectric constant of the low-K dielectric material may be equal to, or greater than 2.5 and smaller than 2.9. The low-K dielectric material may include porous silicon oxide, or porous silicon nitride, etc.

The dielectric constant of the ultra-low-K dielectric material may be lower than 2.5. The ultra-low-K dielectric material may include porous SiCOH, etc.

In one embodiment, the second sub-dielectric layer 252 is made of silicon oxide. The second sub-dielectric layer 252 may be formed by a CVD process, a PVD process, or an ALD process. The CVD process may include a high density plasma (HDP) deposition process, or a plasma-enhanced CVD (PECVD) process, etc.

Figure 8:
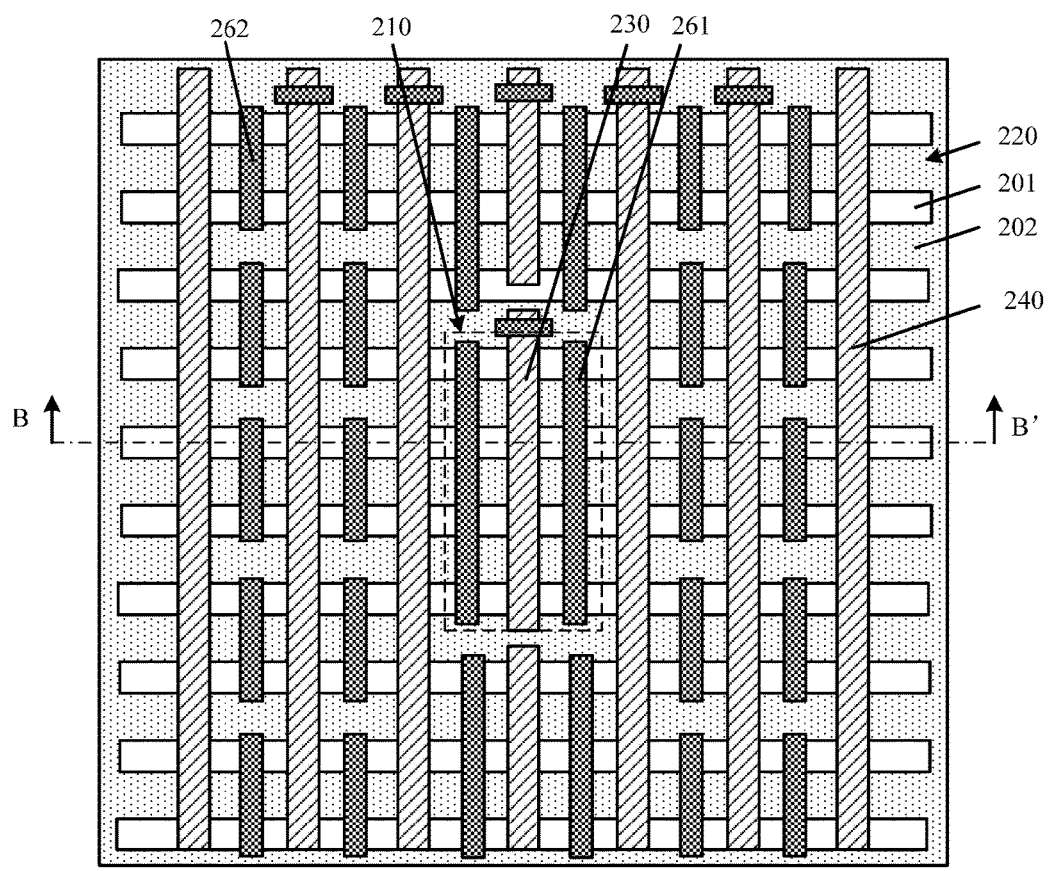

Returning to FIG. 11, after forming the second sub-dielectric layer 252, first conductive structures and second conductive structures may be formed (S104). FIG. 8-9 illustrates a corresponding semiconductor structure. FIG. 9 is a cross-sectional view of the structure illustrated in FIG. 8 along the BB' direction. In FIG. 8, the first sub-dielectric layer 251 and the second sub-dielectric layer 252 and the source/drain regions 203 are omitted.

As shown in FIGS. 8-9, a plurality of first conductive structures 262 are formed in the peripheral region 220. Each first conductive structure 262 may be in between two adjacent second gate structures 240. The first conductive structures 262 may cross over at least two fins 201. Further, the first conductive structures 262 may be on the surfaces of the source/drain regions 203 in at least two fins 201.

In one embodiment, the first conductive structures 262 may be formed in the first sub-dielectric layer 251 and the second sub-dielectric layer 252 between adjacent second gate structures 240; and the first conductive structures 262 may be on the surfaces of the source/drain regions 203. That is, the first conductive structures 262 may be in the dielectric layer; and may penetrate through the dielectric layer. The first conductive structures 262 may apply bias voltages to the source/drain regions 203 between adjacent second gate structures 240.

Further, a plurality of second conductive structures 261 may be formed in the to-be-tested region 210. Each second conductive structure 261 may be in between a first gate structure 230 and an adjacent second gate structure 240. The second conductive structures 261 may cross over at least two fins 201. Further, the second conductive structures 261 may be on the surfaces of source/drain regions 203 in at least two fins 201. The second conductive structures 261 may apply bias voltages to the source/drain regions 203 at the two sides of the first gate structure 230.

In certain other embodiments, third conductive structures (not shown) may be formed on the tops of the first gate structure 230 and the second gate structures 240. The third gate structures may be used to apply bias voltages to the gate layers of the first gate structure 230 and the second gate structures 240.

In the peripheral region 220, the surfaces of the source/drain regions 203 at two sides of the second gate structure 240 on the surface of at least one fin 201 may all have first conductive structures 262. The first conductive structures 262 may electrically connect the source/drain regions 203 of two adjacent fins 201; and carriers in the source/drain regions 203 of the two adjacent fins 201 may migrate. Further, the heat in the fins 201 in the to-be-tested region 210 may be transferred from the shared source/drain regions 203 to the fins 201 in the peripheral region 220. The heat transferred to the fins 201 in the peripheral region 220 may be further transferred to the plurality of parallel fins 201 in the peripheral region 220 by the first conductive structures 262. Thus, the heat generated by the self-heating of the FinFETs in the fins 201 in the to-be-tested region 210 may be transferred to the fins 201 in the surrounding peripheral region 220. Using the disclosed test structure, the heat distribution and changes in the peripheral region 220 may be monitored; and based on the monitoring results, the semiconductor devices may be improved.

In one embodiment, the first conductive structures 262 and the second conductive structures 261 may be formed simultaneously. The process for forming the first conductive structures 262 and the second conductive structures 261 may include forming trenches in the first sub-dielectric layer 251 and the second sub-dielectric layer 252 between the first gate structures 230 and the adjacent second gate structures 240 and between adjacent second gate structures 240 in the to-be-tested region 210 and the peripheral region 220 by an etching process. The trenches may expose portions of the surfaces of the source/drain regions 203, portions of the side surfaces of the fins 201 and portions of the surface of the insulation layer 202. Then, a conductive layer may be filled in the trenches; and a planarization process may be performed until the second sub-dielectric layer 252 is exposed. Thus, the first conductive structures 262 and the second conductive structures 261 may be formed.

The conductive material may include one or more of Cu, W, Al, Ti, Ta, TiN, and TaN, etc. Various processes may be used to fill the conductive material into the trenches, such as a CVD process, a PVD process, an ALD process, an electroplating process, or a chemical plating process, etc.

Thus, a test structure may be formed by the disclosed methods and processes; and FIGS. 8-9 illustrate a corresponding semiconductor structure.

As shown in FIGS. 8-9, the test structure may include a substrate 200 having a to-be-tested region 210 and a peripheral region 220 surrounding the to-be-tested region 210. The surface of the to-be-tested region 210 and the peripheral region 220 may have at least one fin 201, respectively. The at least one fin 201 in the to-be-tested region 210 and the at least one fin 201 in the peripheral region 220 may be parallel. The two ends of the at least one fin 201 in the to-be-tested region 210 may extend to the peripheral region 220.

Further, the test structure may also include an insulation layer 202 formed on the surface of the substrate 200. The insulation layer 202 may cover portions of the side surfaces of the fins 201.

Further, the test structure may also include a plurality of first gate structures 230 crossing over the at least one fin 201 in the to-be-tested region 210. The first gate structures 230 may cover portions of the side surfaces and the top surface of the at least one fin 201 in the to-be-tested region 210.

Further, the test structure may also include a plurality of second gate structures 240 crossing over portions of the side surfaces and top surfaces of the at least one fin 201 in peripheral region 220. The plurality of second gate structures 240 may be parallel; and the plurality of second gate structures 240 may be parallel to the first gate structures 230.

Further, the test structure may also include source drain/regions 203 formed in the portions of the fins 201 between adjacent second gate structures 240, and between the first gate structure 230 and adjacent second gate structures 240.

Further, the test structure may also include a plurality of first conductive structures 262 in the peripheral region 220. Each of the first conductive structure 262 may be in between adjacent second gate structures 240. The first conductive structures 262 may cross over at least two fins 201. Further, the first conductive structures 262 may be on the surfaces of the source/drain regions 203 in at least two fins 201.

Further, the test structure may also include a plurality of second conductive structures 261 formed in the to-be-tested region 210. Each second conductive structure 261 may be in between a first gate structure 230 and an adjacent second gate structure 240. The second conductive structures 261 may cross over at least two fins 201. Further, the second conductive structures 261 may be on the source/drain regions 203 in at least two fins 201. The detailed structures and intermediate structures are described above with respect to the fabrication processes.

FIG. 10 illustrates an exemplary test method consistent with the disclosed embodiments. The test method may utilize the disclosed test structures, or other appropriate test structures. For illustrative purposes, the disclosed test structure illustrated in FIGS. 8-9 will be used to describe the test method.

As shown in FIG. 10, the test method may include providing a test structure (S1). The test structure may be the test structure illustrated in FIGS. 8-9.

As shown in FIGS. 8-9, one first gate structure 230 and the source/drain regions 203 at two sides of the first gate structure 230 may form a first transistor. One second gate structure 240 and the source/drain regions 203 at two sides of the second gate structure 240 may form a second transistor. The to-be-tested region 210 may have at least one first transistor; and the peripheral region 220 may have a plurality of second transistors.

Returning to FIG. 10, after providing the test structure having the at least one first transistor and the plurality of second transistors, the at least one first transistor and the second transistors may be turned on (S2). As shown in FIGS. 8-9, the first transistor may be turned on. That is, the first channel region in the fin 201 under the first gate structure 230 may be turned on. Further, the second transistors may be turned on. That is, the channel regions of the fins 201 under the second gate structures 230 may be turned on.

In the to-be-tested region 210, after turning the first channel region, an electrical current may flow in the first channel region; and heat may be generated in the fin 201 in the first region 210. Because the two ends of the fin 210 in the to-be-tested region 210 may extend to the peripheral region 220; and the first gate structure 230 and the adjacent second gate structures 240 may share source/drain regions 202, the first transistor may be connected in serial with at least one second transistor. The heat in the fin 201 in the to-be-tested region 210 may be transferred into the fin 201 in the peripheral region 220 through the shared source/drain regions 203 and the second channel regions. The heat may be transferred into the plurality of parallel fins 201 in the peripheral region 220 through the first conductive structures 262. The heat in the to-be-tested region 210 may be transferred into the fins 201 in the surrounding peripheral region 220; and the temperature of the fins 201 in the peripheral region 220 may change with time.

Returning to the FIG. 10, after turning on the first transistor and the second transistors, temperature tests may be performed (S3). Referring to FIGS. 8-9, after turning on the first transistor and the second transistors, in each predetermined time interval, a temperature test may be performed on the second transistors; and the temperatures of the fins 201 under the plurality of the second gate structures 240 may be obtained.

Because the peripheral region 220 may have a plurality of second transistors; and the second transistors may be evenly distributed in the surrounding regions of the to-be-tested region 210, by testing the temperature of each individual second transistor, the temperatures of the fins 201 in the corresponding second transistors may be obtained. Accordingly, the temperatures in the plurality of fins 201 in the peripheral regions 220 may be obtained.

The temperature test may include testing the saturated currents and gate voltages of the plurality of second transistors to obtain correlation curves of the saturated currents and the gate voltages of the plurality of second transistors; obtaining the slopes of the correlation curves of the saturated currents and the gate voltages; and obtaining the temperatures of the fins 201 under the second gate structures 240. The slope of the correlation curve of the saturated current and the gate voltage may be the slope of a sub-threshold value, or the sub-threshold swing.

Specifically, for a PMOS transistor, the slope may be approximately equal to $(kT/q)*Ln(Nd/Ni)$. Nd refers to the concentration of the donors. Ni refers to the concentration of the intrinsic carriers. Thus, the temperature of the channel region may be calculated through the slope.

Thus, by obtaining the saturated current and the gate voltage of each of the plurality of second transistors, the temperatures of the second channel regions of the second transistors may be calculated. Accordingly, the temperatures of the second channel regions of the plurality of second transistors in the peripheral region 220 at the current time may be obtained. That is, the temperature distribution status in the fins 201 in the peripheral region 220 may be obtained. For example, the equal-temperature lines of the plurality of fins 201 in the peripheral region 220 may be plotted.

Returning to FIG. 10, after measuring the temperatures of the second transistors, the correlation information between temperatures in the fins and time in the second region 220 may be obtained (S4). Specifically, the temperature changes at different positions of the plurality of fins 201 in the second region 220 with time may be obtained. For example, the increasing rate or decreasing rate of the temperature of the fins 201 at different positions of the peripheral region 220 may be obtained.

Using the tested information from the disclosed test structure, the heat distribution and change in the peripheral region 220 may be monitored. Accordingly, one may be able to improve the semiconductor device according to the monitoring data.

According to the disclosed methods and processes, in the test structures, the to-be-tested region may have at least one fin having two ends extending into the peripheral region. The surface of the fin in the top-be-tested region may have at least one first gate structure; and the surfaces of the fins in the peripheral region may have a plurality of second gate structures. Because there may be one source/drain region in a portion of the fin in between adjacent second gate structures and/or between a first gate structure and an adjacent second gate structure, the first gate structure and the plurality of second gate structures on the same fin with the first gate structure may share source/drain regions. When the fin under the first gate structure is turned on, the fin in the to-be-tested region may start generating heat. Because the first gate structure and the plurality of second gate structures may share source/drain regions, it may be easy for the fin in the to-be-tested region to transfer the heat to the peripheral region. Further, because the peripheral region may have a plurality of first conductive structures; the first conductive structures may cross over at least two fins; and the first conductive structures may be on the surfaces of the source/drain regions of at least two fins, the first conductive structures may electrically connect the source/drain regions in the at least two fins; and the first conductive structures may be able to further transfer the heat generated from the fin in the to-be-tested region to the plurality of parallel fins in the peripheral region. Thus, the heat generated in the fin in the to-be-tested region may be transferred to the fins in the entire peripheral region. During each pre-determined time interval, the temperature of the fins under the second gate structures may be tested; and the temperatures of the fins under the second gate structures may be obtained. Thus, the correlation between the temperatures of the fins under the second gate structures and time may be obtained. For example, the change of the equal-temperature lines of the fins in the peripheral region with time may be plotted. Thus, by using the disclosed test structure, the effect of the devices in the to-be-tested region to the temperatures at the different positions of the peripheral region may be obtained. Accordingly, the fabrication process, the structure and the electrical properties of the semiconductor devices may be modified to improve the performance of the semiconductor device.

Further, at least one second gate structure and one first gate structure may be formed on the surface of a same fin, and the first gate structure and the second gate structures may share source/drain regions. Based on the hot carrier injection effect, such a structure may be able to transfer the heat in the fin in the to-be-tested region to the fins in the peripheral region through the shared source/drain regions. Thus, the temperature change trend in the plurality of the fins in the peripheral region may be obtained.

In the disclosed fabrication method of the test structure, the two ends of at least one fin in the to-be-tested region may extend into the peripheral region. A first gate structure may be formed on the surface of the fin in the to-be-tested region; and a plurality of second gate structures may be formed on the surfaces of the fins in the peripheral region. By forming source/drain regions in the portions of fins between adjacent second gate structures and/or the portions of the fins between the first gate structure and adjacent second gate structures, the first gate structure and the second gate structures on same fins may share source/drain regions. Because the first gate structure and the second gate structures may share source/drain regions, the heat in the to-be-tested region may be easily transferred to the fins in the peripheral region. Further, a plurality of first conductive structures may be formed on surfaces of the source/drain regions in the peripheral region; and the first conductive structures may cross over at least two fins. Thus, the first conductive structures may be able to further transfer the heat to the plurality of parallel fins in the peripheral region. Thus, using the disclosed test structure, the effect of the devices in the to-be-tested region to the temperatures at different positions of the peripheral region may be obtained. Accordingly, the fabrication process, structures and the electrical properties of the devices may be modified to improve the performances of the devices.

In the disclosed test method, the heat generated in the fin in the to-be-tested region may be transferred to the entire peripheral region. During each pre-determined time interval, the temperatures of the fins under the second gate structures may be tested; and the temperatures of the fins under the second gate structures may be obtained. Thus, the correlation between the temperatures of the fins under the second gate structures and time may be obtained. For example, the change of the equal-temperature lines of the fins in the peripheral region with time may be plotted. Thus, by using the disclosed test structure, the effect of the devices in the to-be-tested region to the temperature at the different positions of the peripheral region may be obtained. Accordingly, the fabrication processes, the structures and the electrical properties of the semiconductor devices may be modified to improve the performances of the semiconductor devices.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A test structure, comprising:
   a substrate having a to-be-tested region and a peripheral region surrounding the to-be-tested region, the to-betested region having at least one fin, the peripheral region having at least one fin, the at least one fin in the to-be-tested region being parallel to the at least one fin in the peripheral region, and two ends of the at least one fin in the to-be-tested region extending into the peripheral region;

an insulation layer covering portions of side surfaces of the fins;

at least one first gate structure covering side and top surfaces of the at least one fin in the to-be-tested region;

a plurality of parallel second gate structures covering side and top surfaces of the at least one fin in the peripheral region, and the second gate structures being parallel to the first gate structure;

source/drain regions formed in portions of the at least one fin between adjacent second gate structures and portions of the at least one fin between the at least one first gate structure and adjacent second gate structures; and a plurality of first conductive structures formed between adjacent second gate structures in the peripheral region, the plurality of first conductive structures crossing over at least two fins, and the plurality of first conductive structures being on surfaces of source/drain regions of at least two fins.

2. The test structure according to claim 1, wherein in the to-be-tested region:
a number of the first gate structure is equal to or greater than 1; and
each first gate structure crosses over one or more parallel fins.

3. The test structure according to claim 2, wherein:
when the number of the first gate structure is greater than 1, the plurality of first gate structures are parallel.

4. The test structure according to claim 1, wherein:
the plurality of second gate structures cross over one or more parallel fins.

5. The test structure according to claim 1, wherein:
at least one of the plurality of second gate structures and the at least one first gate structure are on a surface of a same fin.

6. The test structure according to claim 1, further comprising:
at least one second conductive structure formed in the to-be-tested region,
wherein:
the at least one second conductive structure is in between a first gate structure and an adjacent second gate structure;
the at least one second conductive structure crosses over at least two fins; and
the at least one second conductive structure is on surfaces of source/drain regions in at least two fins.

7. The test structure according to claim 1, wherein the source/drain regions comprise:
stress layers doped with certain ions.

8. The test structure according to claim 7, wherein:
the stress layers are made of one of silicon and silicon germanium; and
doping ions are P-type ions.

9. The test structure according to claim 7, wherein:
the stress layers are made of one of silicon and silicon carbide; and
doping ions are N-type ions.

10. The test structure according to claim 1, further comprising:

a plurality of third conductive structures formed on portions of the at least one first gate structure and the plurality of second gate structures.

11. The test structure according to claim 1, further comprising:
a dielectric layer formed on surfaces of the insulation layer, the fins, the at least one first gate structure and the plurality of second gate structures; and
the plurality of first conductive structures are formed in the insulation layer, and penetrate through the dielectric layer.

12. The test structure according to claim 1, wherein:
the plurality of first conductive structures are formed on portions of side surfaces of the fins and portions of a surface of the insulation layer.

13. The test structure according to claim 1, wherein:
surfaces of a source region and a drain region at both sides of a second gate structure on a surface of at least one fin all have at least one first conductive structure.

14. The test structure according to claim 1, wherein the at least one first gate structure and the plurality of second gate structures comprise:
a gate dielectric layer formed on portions of side and top surfaces of the fins;
a gate electrode layer formed on the gate dielectric layer; and
sidewall spacers formed on side surfaces of the gate electrode layer and the gate dielectric layer.

15. The test structure according to claim 14, wherein:
the gate dielectric layer is made of a high dielectric constant (high-K) material; and
the gate electrode layer is made of one or more of metal and metal compound.

16. A method for forming a test structure, comprising:
providing a substrate having a to-be-tested region and a peripheral region;
forming at least one fin on the substrate in the to-be-tested region and at least one fin on the substrate in the peripheral region;
wherein:
the at least one fin in the to-be-tested region and the at least one fin in the peripheral region are parallel; and
two ends of the at least one fin in the to-be-tested region extends into the peripheral region,
forming an insulation layer covering portions of side surfaces of the at least one fin over the substrate;
forming at least one first gate structure crossing over the at least one fin in the to-be-tested region and covering portions of side surfaces of the at least one fin in the to-be-tested region over the insulation layer;
forming a plurality of parallel second gate structures covering portions of side surfaces of the at least one fin in the peripheral region, crossing over the at least one fin in the peripheral region and being parallel to the at least one first gate structure over the insulation layer;
forming source/drain regions in portions of the at least one fin between adjacent second gate structures and portions of the at least one fin between the at least one first gate structure and adjacent second gate structures; and
forming a plurality of first conducive structures in the peripheral region,
wherein:
the plurality of first conductive structures are in between adjacent second gate structures,
the plurality of first conductive structures cross over at least two fins; and the plurality of first conductive structures are on surfaces of source/drain regions of at least two fins.

17. The method according to claim 16, wherein forming the at least first gate structure and the plurality of second gate structures comprises:
forming at least one first dummy gate structure having a dummy gate layer, crossing over the at least one fin in the to-be-tested region, and covering portions of side and top surfaces of the at least one fin in the to-be-tested region over the substrate;
forming a plurality of parallel second dummy gate structures having a dummy gate layer, crossing over the at least one fin in the peripheral region, and covering portions of side and top surfaces of the at least one fin in the peripheral region and being parallel with the at least one first dummy gate structure over the substrate;
forming a first sub-dielectric layer exposing top surfaces of the dummy gate layer on surfaces of the insulation layer and the at least one fin and side surfaces of the at least one first dummy gate structure and the at least one second dummy gate structure;
removing the dummy gate layer to form trenches in the first sub-dielectric layer;
forming a gate dielectric layer on inner surfaces of the trenches;
forming a gate layer on a surface of the gate dielectric layer by filling the trenches; and
planarizing the gate dielectric layer and the gate layer until a surface of the first sub-dielectric layer is exposed.

18. The method according to claim 17, wherein forming the plurality of first conductive structures comprises:
forming a second sub-dielectric layer on surfaces of the at least one first gate structure and the at least one second gate structure; and
forming the plurality of first conductive structures in portions of the first sub-dielectric layer and the second sub-dielectric layer between adjacent second gate structures and on surfaces of the source/drain regions.

19. A test method, comprising:
providing a test structure having a substrate having a to-be-tested region and a peripheral region surrounding the to-be-tested region, the to-be-tested region having at least one fin, the peripheral region having at least one fin, the at least one fin in the to-be-tested region being parallel to the at least one fin in the peripheral region, and two ends of the at least one fin in the to-be-tested region extending into the peripheral region; an insulation layer, covering portions of side surfaces of the at least one fin; at least one first gate structure covering side and top surfaces of the at least one fin in the to-be-tested region; a plurality of parallel second gate structures covering side and top surfaces of the at least one fin in the peripheral region, and the second gate structures being parallel to the first gate structure; source/drain regions formed in portions of the at least one fin between adjacent second gate structures and portions of the at least one fin between the at least one first gate structure and adjacent second gate structures; and a plurality of first conductive structures formed between adjacent second gate structures in the peripheral region, the plurality of first conductive structures crossing over at least two fins, and the plurality of first conductive structures being on surfaces of source/drain regions of at least two fins,
wherein:
a first gate structure and a source region at one side of the first gate structure and a corresponding drain region at another side of the first gate structure form a first transistor;
a second gate structure and a source region at one side of the second gate structure and a corresponding drain region at another side of the second gate structure form a second transistor;
the to-be-test region has at least one first transistor; and
the peripheral region has a plurality of second transistors,
turning on the at least one first transistor;
performing temperature tests on the plurality of second transistors with pre-determined time intervals to obtain temperatures of the at least one fin under the second gate structures; and
obtaining correlations between the temperatures of the at least one fin in the peripheral region and time.

20. The test method according to claim 19, wherein the temperature tests comprise:
testing saturated currents and gate voltages of the second transistors to obtain correlation curves of the saturated currents and the gate voltages of the second transistors;
obtaining slopes of the correlation curves of the saturated currents and the gate voltages of the second transistors; and
obtaining temperatures of the at least one fin under the second gate structures according to the slopes of the correlation curves of the saturated currents and the gate voltages of the second transistors.

* * * * *